US011735683B1

United States Patent
Huang et al.

(10) Patent No.: US 11,735,683 B1
(45) Date of Patent: Aug. 22, 2023

(54) SINGLE-CRYSTAL BETA-GA$_2$O$_3$ MSM DETECTOR AND PREPARATION METHOD THEREOF

(71) Applicants: SHANDONG UNIVERSITY, Shandong (CN); YANSHAN UNIVERSITY, Hebei (CN)

(72) Inventors: Chuanzhen Huang, Qinhuangdao (CN); Long Tian, Jinan (CN); Hanlian Liu, Jinan (CN); Zhenyu Shi, Jinan (CN); Peng Yao, Jinan (CN); Dun Liu, Jinan (CN); Bin Zou, Jinan (CN); Hongtao Zhu, Jinan (CN); Zhen Wang, Qinhuangdao (CN); Minting Wang, Qinhuangdao (CN); Jun Wang, Qinhuangdao (CN); Longhua Xu, Qinhuangdao (CN); Shuiquan Huang, Qinhuangdao (CN); Meina Qu, Qinhuangdao (CN); Zhengkai Xu, Qinhuangdao (CN); Yabin Guan, Qinhuangdao (CN)

(73) Assignees: SHANDONG UNIVERSITY, Jinan (CN); YANSHAN UNIVERSITY, Qinhuangdao (CN)

(*) Notice: Subject to any disclaimer, the term of this patent is extended or adjusted under 35 U.S.C. 154(b) by 0 days.

(21) Appl. No.: 18/169,552

(22) Filed: Feb. 15, 2023

(30) Foreign Application Priority Data

Oct. 27, 2022 (CN) .......................... 202211324539.3

(51) Int. Cl.
*H01L 31/18* (2006.01)
*C01G 15/00* (2006.01)
(Continued)

(52) U.S. Cl.
CPC .............. *H01L 31/18* (2013.01); *C01G 15/00* (2013.01); *C23C 14/022* (2013.01);
(Continued)

(58) Field of Classification Search
CPC ......... H01L 31/07; H01L 31/18; C23C 14/08; C23C 14/24; C23C 18/1642; C23C 14/0617; C01G 15/00
See application file for complete search history.

(56) References Cited

U.S. PATENT DOCUMENTS

2019/0019901 A1* 1/2019 Li ................... H01L 31/022408

\* cited by examiner

*Primary Examiner* — Jaehwan Oh
(74) *Attorney, Agent, or Firm* — Oliff PLC

(57) ABSTRACT

A single-crystal β-Ga$_2$O$_3$ MSM detector and a preparation method thereof, comprising: machining grooves on a single-crystal β-Ga$_2$O$_3$ substrate using a laser-assisted waterjet machining technique to form a 3D shape; wet etching the machined single-crystal β-Ga$_2$O$_3$ substrate using an HF solution to remove machining damage; performing Au evaporation on a surface of the single-crystal β-Ga$_2$O$_3$ substrate after processing, coating an Au thin film on the surface of the single-crystal β-Ga$_2$O$_3$ substrate; and grinding the surface of the single-crystal β-Ga$_2$O$_3$ substrate after evaporation to remove the Au thin film on an undressed surface and retain the Au thin film in the grooves, and then obtaining the single-crystal β-Ga$_2$O$_3$ MSM detector.

10 Claims, 2 Drawing Sheets

(51) Int. Cl.
  *H01L 31/108*     (2006.01)
  *H01L 31/0224*    (2006.01)
  *C30B 29/16*      (2006.01)
  *C30B 33/04*      (2006.01)
  *C23C 14/02*      (2006.01)
  *C23C 14/18*      (2006.01)
  *C23C 14/24*      (2006.01)
  *C30B 33/10*      (2006.01)
  *H01L 31/032*     (2006.01)

(52) U.S. Cl.
  CPC ............ *C23C 14/028* (2013.01); *C23C 14/18* (2013.01); *C23C 14/24* (2013.01); *C30B 29/16* (2013.01); *C30B 33/04* (2013.01); *C30B 33/10* (2013.01); *H01L 31/022408* (2013.01); *H01L 31/1085* (2013.01); *H01L 31/032* (2013.01)

SINGLE-CRYSTAL BETA-GA₂O₃ MSM DETECTOR AND PREPARATION METHOD THEREOF

CROSS-REFERENCES TO RELATED APPLICATIONS

This application claims priority benefits to Chinese Patent Application No. 202211324539.3, filed 27 Oct. 2022, the contents of which are incorporated herein by reference.

TECHNICAL FIELD

The present invention belongs to the field of combined laser micro-machining technology, and specifically relates to a single-crystal β-Ga₂O₃ MSM (metal—semiconductor—metal) detector and a preparation method thereof.

BACKGROUND

The statements in this section merely provide background related to the present invention and do not necessarily constitute prior art.

Gallium oxide (β-Ga₂O₃), as a new generation of oxide semiconductor material, has advantages such as an ultra-wide forbidden band, high breakdown electric field strength, high UV transmittance, and stable physical and chemical properties. The Ga₂O₃ has an absorb edge of 240-280 nm, which is located in the solar blind ultraviolet (UV) band, and has good transmittance from the UV light to visible light, so it is an excellent solar blind detector material. However, because Ga₂O₃ is a hard and brittle material that is easy to dissociate, it is easy to produce scratches, dissociation pits, abrasive embedding, and other defects during precision machining. Meanwhile, due to the poor thermal conductivity and large anisotropy of single-crystal Ga₂O₃, it is easy to produce microcracks during laser machining. This greatly restricts the application and development of single-crystal Ga₂O₃.

The current preparation method of the β-Ga₂O₃ MSM detector is to carry out the photolithography on β-Ga₂O₃ thin film, and for the single-crystal β-Ga₂O₃ substrate, if it is machined by photolithography again, it cannot give full play to the advantages of the single-crystal β-Ga₂O₃ substrate (the photolithography on the MSM detector is to carry out the process in 2D directions on the substrate surface, which is suitable for application on β-Ga₂O₃ thin film substrates. For the single-crystal substrates, the surface of the substrate can be machined into a 3D shape by etching, laser and other machining methods, thus increasing Ohmic contact area between the metal and β-Ga₂O₃). Therefore, it is necessary to process the 3D shape on the single-crystal β-Ga₂O₃ substrate. At present, the machining method of single-crystal Ga₂O₃ is mainly wet etching, although it is not chemically resistant like sapphire (Al₂O₃), β-Ga₂O₃ is still difficult to wet etch, and in sputtered Ga₂O₃ thin films deposited at substrate temperature of 400-1000° C., an etching rate of Ga₂O₃ grown at 400° C. is about 490 nm/s, while the etching rate of the thin film grown at 1000° C. is only about 0.196 nm/s.

SUMMARY

For existing technology that existed in the inadequacies, it is an object of the present invention to provide a single-crystal β-Ga₂O₃ MSM detector and a preparation method thereof.

To achieve the above purpose, the present invention is realized by the following technical solutions:

In a first aspect of the present invention, a method for preparing a single-crystal β-Ga₂O₃ MSM detector is provided, comprising the following steps:

machining grooves on a single-crystal β-Ga₂O₃ substrate using a laser-assisted waterjet machining technique to form a 3D shape;

wet etching the machined single-crystal β-Ga₂O₃ substrate using an HF (Hydrofluoric Acid) solution to remove machining damage;

performing Au evaporation on a surface of the single-crystal β-Ga₂O₃ substrate after processing, coating an Au thin film on the surface of the single-crystal β-Ga₂O₃ substrate; and grinding a surface of the single-crystal β-Ga₂O₃ substrate after evaporation to remove the Au thin film on an undressed surface and retain the Au thin film in the grooves, then obtaining the single-crystal β-Ga₂O₃ MSM detector.

In some examples, the groove is an inverted trapezoidal groove.

In some examples, in the laser-assisted waterjet machining technique, the pulse width of a nanosecond laser is 10-350 ns, the pulse repetition frequency is 20-1000 kHz, the scanning speed is 1-16 mm/s, and the waterjet pressure is 4-16 MPa.

Preferably, the waterjet pressure is 5-10 MPa.

Preferably, the wavelength of the nanosecond laser is 1064 nm.

Further preferably, the laser single-pulse energy is 0.02-0.1 mJ and the focal plane focal is −0.1-0.1 mm.

Preferably, in the laser-assisted waterjet machining technique, the target distance of the nozzle of the waterjet is 0.3-1.4 mm, the offset distance of the waterjet is 0.3-0.7 mm, and the impact angle of the waterjet is 39°-51°.

The waterjet may gradually diverge with the increase of the target distance, and if the target distance is too large, the quality of the waterjet impinging on the surface of the workpiece is poor, and the water layer formed on the surface of the workpiece is unstable, which will make the laser unstable after passing through the water layer, thus affecting the machining quality; if the target distance is too small, the impact of the waterjet on the workpiece is large; meanwhile, due to the limitation of the shape of the nozzle, the minimum target distance is 0.3 mm.

The stress on the surface of the workpiece caused by the impact of the waterjet can be divided into a wall compressive stress and a wall shear stress. Wherein, the wall shear stress is the influencing factor of material removal. If the impact angle is too large, the wall shear stress is small and the material cannot be removed; if the impact angle is too small, the wall shear stress is large, and then the material will have a large area of brittle peeling in the machining, resulting in poor machining quality.

In some examples, the concentration of the HF solution for wet etching is 47-49%, the etching temperature is 5-25° C., and the etching time is 8-15 min.

The following is a reaction mechanism for wet etching of β-Ga2O3 in HF solution:

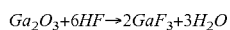

$$Ga_2O_3 + 6HF \rightarrow 2GaF_3 + 3H_2O$$

In some examples, the grinding fluid used for the grinding is 1-2.5 μm of Al₂O₃ grinding fluid, and the grinding disc is a softer grinding disc made of lead.

In a second aspect of the present invention, a 3D single-crystal β-Ga₂O₃ MSM detector is provided, which is prepared by the preparation method described above.

The beneficial effects achieved by one or more examples of the present invention described above are as follows:

The material removal mechanism of the laser-assisted waterjet machining technique is not the same as that of laser machining, which uses high temperature to vaporize the material, while in the laser-assisted waterjet machining, the laser only has the effect of heating and softening the material, and the material is removed by the impact of high-pressure waterjet after softening, which greatly reduces the recast layer and thermal cracking and has the advantage of small machining damage.

The crossed inverted trapezoidal grooves provide more contact area for the Au thin film, which can form the Ohmic contact with a larger area between the electrode and the single-crystal β-$Ga_2O_3$ substrate, thus improving the sensitivity of the MSM solar blind detector and reducing the size of the detector.

The present invention combines the laser-assisted waterjet machining technique with wet etching, which can efficiently carry out a rough machining of the 3D shape by the laser-assisted waterjet machining technique, and remove the machining damage and reduce surface roughness by wet etching.

BRIEF DESCRIPTION OF THE DRAWINGS

The accompanying drawings constituting a part of the present invention are used to provide a further understanding of the present invention. The exemplary examples of the present invention and descriptions thereof are used to explain the present invention, and do not constitute an improper limitation of the present invention.

DETAILED DESCRIPTION

It should be pointed out that the following detailed descriptions are all illustrative and are intended to provide further descriptions of the present invention. Unless otherwise specified, all technical and scientific terms used in the present invention have the same meaning as those usually understood by a person of ordinary skill in the art to which the present invention belongs.

The present invention will now be further described with reference to the accompanying drawings and examples.

Example 1

Figure 1:
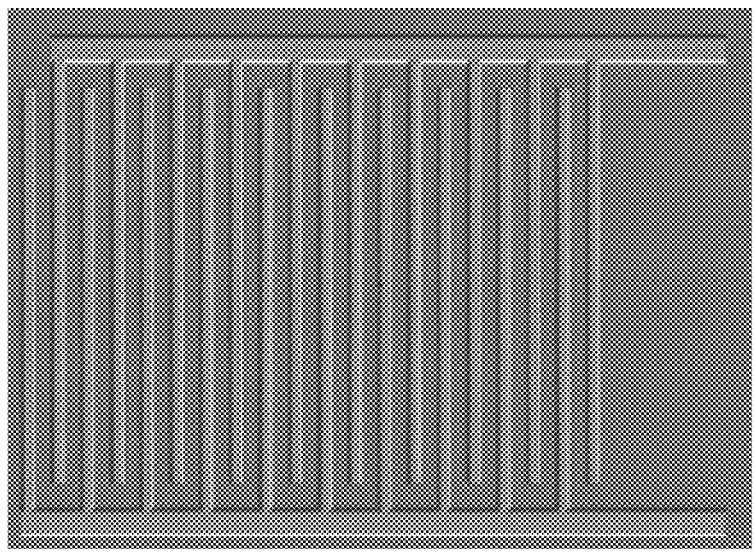
FIG. 1 is a schematic diagram of a surface structure of a prepared single-crystal β-$Ga_2O_3$ MSM detector.
Figure 2:
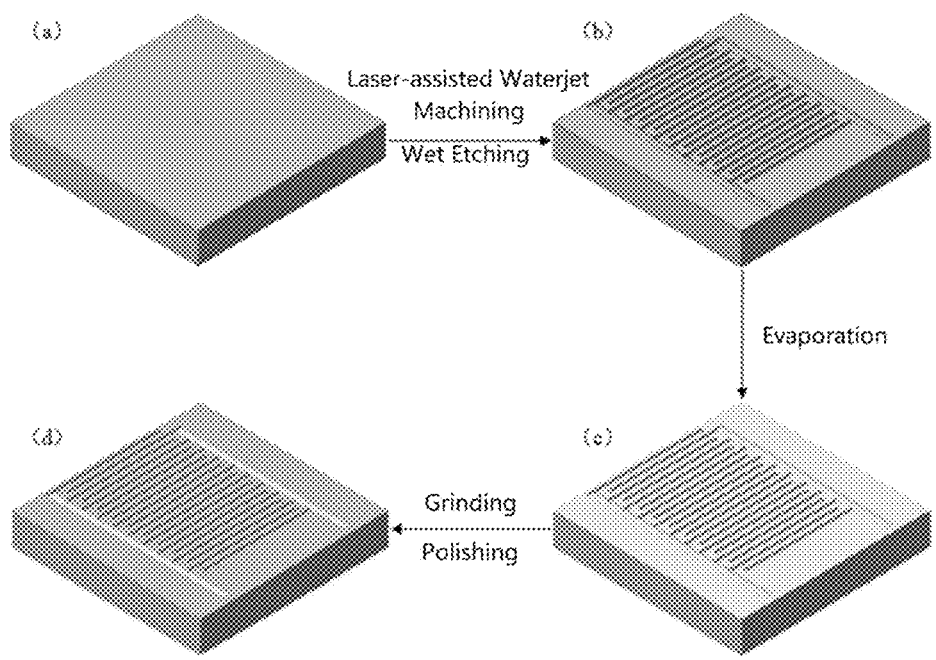
FIG. 2 is a process flow diagram of preparing the single-crystal β-$Ga_2O_3$ MSM detector of examples of the present invention, wherein, (a) is a single-crystal β-$Ga_2O_3$ substrate to be machined, (b) is a schematic diagram of a structure of the MSM detector after laser-assisted waterjet machining and wet etching, (c) is a schematic diagram of a surface of the substrate coated with an Au thin film after evaporation, and (d) is a schematic diagram of the prepared MSM detector after grinding and polishing.

As shown in FIG. 2, a method for preparing a single-crystal β-$Ga_2O_3$ MSM detector, comprising the steps of:
1) Machining to prepare an inverted trapezoidal crossed groove structure using a laser-assisted waterjet.

The present process uses a nanosecond laser with a wavelength of 1064 nm, a laser pulse width of 30 ns and a pulse frequency of 315 kHz.

Figure 3:
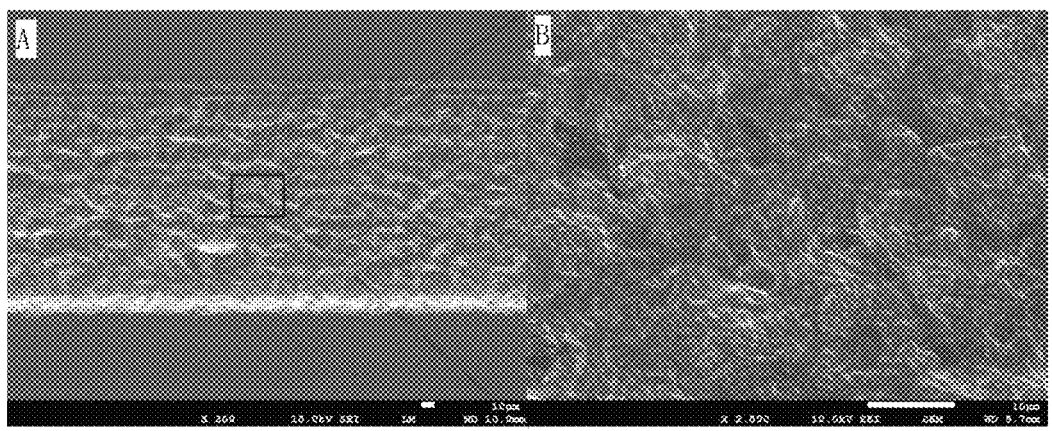
FIG. 3 is a diagram of a surface shape of the single-crystal β-$Ga_2O_3$ machined by the laser-assisted waterjet machining in Example 1, wherein, B is a partial enlargement of A.

(1) cleaning a single-crystal β-$Ga_2O_3$ substrate with ultrasonic cleaning, and mounting the cleaned substrate on a laser-assisted waterjet transparent workbench;

(2) focusing the device to a height of a focal plane of the laser of 0 mm; adjusting the relative position of the laser and the waterjet to an angle of the waterjet of 45°, an offset distance of the waterjet of 0.5 mm and a target distance of a nozzle of the waterjet of 0.6 mm;

(3) setting the laser parameters to a pulse width of 30 ns, a pulse frequency of 315 kHz, an average power of the laser of 20 W, a scanning speed of 1 mm/s, a machining times of once and a lateral offset distance of 10 μm;

(4) adjusting a waterjet pressure of 6 MPa; and (5) running a machining program for MSM structure machining, and obtaining the inverted trapezoidal groove after the machining with a depth of 15-25 μm and a width of 50-60 μm; a diagram of a shape of the single-crystal β-$Ga_2O_3$ machined by the laser-assisted waterjet machining, as shown in FIG. 3.

2) Wet etching on the machined single-crystal β-$Ga_2O_3$.

The etching solution used for the present process is an HF solution with a solution concentration of 47-49% and an etching temperature of 5-25° C.

(1) cleaning and placing the single-crystal β-$Ga_2O_3$ substrate in a beaker;

(2) preparing the HF solution with a solubility of 49%;

(3) pouring the prepared HF solution into the beaker until the substrate is submerged and reacting for 10 min at room temperature (20° C.); and (4) taking out and cleaning the substrate.

3) Evaporation of the single-crystal β-$Ga_2O_3$.

(1) mounting the processed single-crystal β-$Ga_2O_3$ substrate on an evaporation workbench;

(2) evaporating a surface of the single-crystal β-$Ga_2O_3$ substrate with a layer of nanoscale Au thin film; and (3) taking out the substrate.

4) Grinding of the single-crystal β-$Ga_2O_3$.

A grinding fluid used in the present process is 1 μm of $Al_2O_3$ grinding fluid, and a grinding disc is a softer grinding disc made of lead.

(1) mounting the single-crystal β-$Ga_2O_3$ substrate on a grinding workbench;

(2) mounting the grinding disc made of lead, and spraying the 1 μm of $Al_2O_3$ grinding liquid on the grinding disc made of lead;

(3) starting the grinding equipment for grinding;

(4) taking out the single-crystal β-$Ga_2O_3$ substrate after grinding for a period of time and observing under a microscope whether the Au thin film on the micro-machined surface is completely removed, and if it is not completely removed, continuing the grinding until it is completely removed; and (5) cleaning the grinded single-crystal β-$Ga_2O_3$ substrate, and then obtaining the single-crystal β-$Ga_2O_3$ MSM detector.

Example 2

A method for preparing a single-crystal β-$Ga_2O_3$ MSM detector, comprising the steps of:
1) Machining to prepare an inverted trapezoidal crossed groove structure using a laser-assisted waterjet.

The present process uses a nanosecond laser with a wavelength of 1064 nm, a laser pulse width of 20 ns and a pulse frequency of 490 kHz.

(1) cleaning a single-crystal β-$Ga_2O_3$ substrate with ultrasonic cleaning, and mounting the cleaned substrate on a laser-assisted waterjet transparent workbench;

(2) focusing the device to a height of a focal plane of the laser of −0.1 mm; adjusting the relative position of the laser and the waterjet to an angle of the waterjet of 45°, an offset distance of the waterjet of 0.5 mm and a target distance of a nozzle of the waterjet of 0.6 mm;

(3) setting the laser parameters to a pulse width of 20 ns, a pulse frequency of 490 kHz, an average power of the laser of 25 W, a scanning speed of 1 mm/s, a machining times of twice and a lateral offset distance of 15 μm;

(4) adjusting a waterjet pressure of 6 MPa; and (5) running a machining program for MSM structure machining, and obtaining the inverted trapezoidal groove after the machining with a depth of 20-30 μm and a width of 60-70 μm.

2) Wet etching on the machined single-crystal β-$Ga_2O_3$.

The etching solution used for the present process is an HF solution with a solution concentration of 47-49% and an etching temperature of 5-25° C.

(1) cleaning and placing the single-crystal β-$Ga_2O_3$ substrate in a beaker;

(2) preparing the HF solution with a solubility of 47%;

(3) pouring the prepared HF solution into the beaker until the substrate is submerged and reacting for 10 min at room temperature (25° C.); and (4) taking out and cleaning the substrate.

3) Evaporation of the single-crystal β-$Ga_2O_3$.

(1) mounting the processed single-crystal β-$Ga_2O_3$ substrate on an evaporation workbench;

(2) evaporating a surface of the single-crystal β-$Ga_2O_3$ substrate with a layer of nanoscale Au thin film; and (3) taking out the substrate.

4) Grinding of the single-crystal β-$Ga_2O_3$.

A grinding fluid used in the present process is 1 μm of $Al_2O_3$ grinding fluid, and a grinding disc is a softer grinding disc made of lead.

(1) mounting the single-crystal β-$Ga_2O_3$ substrate on a grinding workbench;

(2) mounting the grinding disc made of lead, and spraying the 1 μm of $Al_2O_3$ grinding liquid on the grinding disc made of lead;

(3) starting the grinding equipment for grinding;

(4) taking out the single-crystal β-$Ga_2O_3$ substrate after grinding for a period and observing under a microscope whether the Au thin film on the micro-machined surface is completely removed, and if it is not completely removed, continuing the grinding until it is completely removed; and (5) cleaning the grinded single-crystal β-$Ga_2O_3$ substrate, and then obtaining the single-crystal β-$Ga_2O_3$ MSM detector.

Example 3

A method for preparing a single-crystal β-$Ga_2O_3$ MSM detector, comprising the steps of:

1) Machining to prepare an inverted trapezoidal crossed groove structure using a laser-assisted waterjet.

The present process uses a nanosecond laser with a wavelength of 1064 nm, a laser pulse width of 10 ns and a pulse frequency of 1000 kHz.

(1) cleaning a single-crystal β-$Ga_2O_3$ substrate with ultrasonic cleaning, and mounting the cleaned substrate on a laser-assisted waterjet transparent workbench;

(2) focusing the device to a height of a focal plane of the laser of 0.1 mm; adjusting the relative position of the laser and the waterjet to an angle of the waterjet of 45°, an offset distance of the waterjet of 0.5 mm and a target distance of a nozzle of the waterjet of 0.6 mm;

(3) setting the laser parameters to a pulse width of 10 ns, a pulse frequency of 1000 kHz, an average power of the laser of 30 W, a scanning speed of 1 mm/s, a machining times of 3 times and a lateral offset distance of 10 μm;

(4) adjusting a waterjet pressure of 6 MPa; and (5) running a machining program for MSM structure machining, and obtaining the inverted trapezoidal groove after the machining with a depth of 10-15 μm and a width of 50-60 μm.

2) Wet etching on the machined single-crystal β-$Ga_2O_3$.

The etching solution used for the present process is an HF solution with a solution concentration of 47-49% and an etching temperature of 5-25° C.

(1) cleaning and placing the single-crystal β-$Ga_2O_3$ substrate in a beaker;

(2) preparing the HF solution with a solubility of 47%;

(3) pouring the prepared HF solution into the beaker until the substrate is submerged and reacting for 10 min at room temperature (15° C.); and (4) taking out and cleaning the substrate.

3) Evaporation of the single-crystal β-$Ga_2O_3$.

(1) mounting the processed single-crystal β-$Ga_2O_3$ substrate on an evaporation workbench;

(2) evaporating a surface of the single-crystal β-$Ga_2O_3$ substrate with a layer of nanoscale Au thin film; and (3) taking out the substrate.

4) Grinding of the single-crystal β-$Ga_2O_3$.

A grinding fluid used in the present process is 1 μm of $Al_2O_3$ grinding fluid, and a grinding disc is a softer grinding disc made of lead.

(1) mounting the single-crystal β-$Ga_2O_3$ substrate on a grinding workbench;

(2) mounting the grinding disc made of lead, and spraying the 1 μm of $Al_2O_3$ grinding liquid on the grinding disc made of lead;

(3) starting the grinding equipment for grinding;

(4) taking out the single-crystal β-$Ga_2O_3$ substrate after grinding for a period of time and observing under a microscope whether the Au thin film on the micro-machined surface is completely removed, and if it is not completely removed, continuing the grinding until it is completely removed; and (5) cleaning the grinded single-crystal β-$Ga_2O_3$ substrate, and then obtaining the single-crystal β-$Ga_2O_3$ MSM detector.

The foregoing descriptions are merely preferred examples of the present invention but are not intended to limit the present invention. A person skilled in art may make various alterations and variations to the present invention. Any modification, equivalent replacement, or improvement made within the spirit and principles of the present invention shall fall within the protection scope of the present invention.

What is claimed is:

1. A method for preparing a single-crystal β-$Ga_2O_3$ MSM detector is provided, comprising the following steps:

machining grooves on a single-crystal β-$Ga_2O_3$ substrate using a laser-assisted waterjet machining technique to form a 3D shape;

wet etching the machined single-crystal β-Ga$_2$O$_3$ substrate using an HF (Hydrofluoric Acid) solution to remove machining damage;

performing Au evaporation on a surface of the single-crystal β-Ga$_2$O$_3$ substrate after processing, coating an Au thin film on the surface of the single-crystal β-Ga$_2$O$_3$ substrate; and grinding the surface of the single-crystal β-Ga$_2$O$_3$ substrate after evaporation to remove the Au thin film on an undressed surface and retain the Au thin film in the grooves, then obtaining the single-crystal β-Ga$_2$O$_3$ MSM detector.

2. The method for preparing the single-crystal β-Ga$_2$O$_3$ MSM detector according to claim 1, wherein: the groove is an inverted trapezoidal groove.

3. The method for preparing the single-crystal β-Ga$_2$O$_3$ MSM detector according to claim 1, wherein: in the laser-assisted waterjet machining technique, a pulse width of a nanosecond laser is 10-350 ns, a pulse repetition frequency is 20-1000 kHz, a scanning speed is 1-16 mm/s, and a waterjet pressure is 4-16 MPa.

4. The method for preparing the single-crystal β-Ga$_2$O$_3$ MSM detector according to claim 3, wherein: a wavelength of the nanosecond laser is 1064 nm.

5. The method for preparing the single-crystal β-Ga$_2$O$_3$ MSM detector according to claim 3, wherein: single-pulse energy of the nanosecond laser is 0.02-0.1 mJ, a height of a focal plane is −0.1-0.1 mm.

6. The method for preparing the single-crystal β-Ga$_2$O$_3$ MSM detector according to claim 1, wherein: in the laser-assisted waterjet machining technique, a target distance of a nozzle of the waterjet is 0.3-1.4 mm, an offset distance of the waterjet is 0.3-0.7 mm, and an impact angle of the waterjet is 39°-51°.

7. The method for preparing the single-crystal β-Ga$_2$O$_3$ MSM detector according to claim 1, wherein: a concentration of the HF solution for the wet etching is 47-49%.

8. The method for preparing the single-crystal β-Ga$_2$O$_3$ MSM detector according to claim 1, wherein: an etching temperature is 5-25° C., and an etching time is 8-15 min.

9. The method for preparing the single-crystal β-Ga$_2$O$_3$ MSM detector according to claim 1, wherein: a grinding fluid used for the grinding is a 1-2.5 μm of Al$_2$O$_3$ grinding fluid, a grinding disc is a softer grinding disc made of lead.

10. A 3D single-crystal β-Ga$_2$O$_3$ MSM detector, being prepared by the preparation method of any one of claim 1.

* * * * *